(12) United States Patent
Yamada

(10) Patent No.: US 8,314,450 B2
(45) Date of Patent: Nov. 20, 2012

(54) SOLID-STATE IMAGING DEVICE AND METHOD FOR MANUFACTURING SAME

(75) Inventor: Tohru Yamada, Kyoto (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/875,495

(22) Filed: Sep. 3, 2010

(65) Prior Publication Data

US 2010/0327328 A1 Dec. 30, 2010

Related U.S. Application Data

(63) Continuation of application No. PCT/JP2008/004024, filed on Dec. 26, 2008.

(30) Foreign Application Priority Data

Mar. 6, 2008 (JP) ................................ 2008-056283

(51) Int. Cl.
*H01L 31/062* (2012.01)
*H01L 21/00* (2006.01)

(52) U.S. Cl. ................ 257/290; 257/294; 257/E31.075; 257/E31.078; 257/E27.083; 257/E29.138; 438/22; 438/27; 438/29; 438/65; 438/73

(58) Field of Classification Search .................... 438/22, 438/48, 27, 29, 65, 73–75; 257/290, 294, 257/225, E31.075, E31.078, E31.084, E27.083, 257/E27.15, E29.138

See application file for complete search history.

(56) References Cited

U.S. PATENT DOCUMENTS

| 5,463,232 | A | * | 10/1995 | Yamashita et al. | 257/223 |
|---|---|---|---|---|---|
| 6,194,749 | B1 | | 2/2001 | Ogawa | |
| 6,222,586 | B1 | | 4/2001 | Nagakawa | |
| 7,688,382 | B2 | * | 3/2010 | Nishida et al. | 348/374 |
| 8,017,984 | B2 | * | 9/2011 | Kitano et al. | 257/294 |
| 2005/0274996 | A1 | * | 12/2005 | Iwawaki | 257/292 |
| 2006/0050164 | A1 | | 3/2006 | Ogo et al. | |
| 2006/0166389 | A1 | * | 7/2006 | Miyamoto et al. | 438/22 |
| 2007/0182837 | A1 | * | 8/2007 | Nishijima et al. | 348/275 |

FOREIGN PATENT DOCUMENTS

| JP | 3-126261 A | 5/1991 |
|---|---|---|
| JP | 11-40793 | 2/1999 |
| JP | 2000-124434 | 4/2000 |
| JP | 3255116 | 11/2001 |
| JP | 2004-247691 A | 9/2004 |
| JP | 2005-311208 A | 11/2005 |
| JP | 2005-327869 A | 11/2005 |
| JP | 2006-108609 A | 4/2006 |

* cited by examiner

*Primary Examiner* — Hsien Ming Lee
(74) *Attorney, Agent, or Firm* — McDermott Will & Emery LLP

(57) ABSTRACT

A solid-state imaging device includes: a semiconductor substrate having a plurality of vertical transfer channel regions and a plurality of photoelectric conversion regions arranged in a matrix; a plurality of vertical transfer electrodes, each constructed of a gate electrode and a first metal light-shielding film, formed via a gate insulating film; a transparent insulating film formed in gaps existing between the vertical transfer electrodes above the vertical transfer channel regions; and a second metal light-shielding film formed via a first interlayer insulating film to cover at least the vertical transfer channel regions.

14 Claims, 11 Drawing Sheets

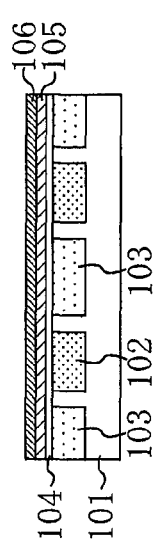
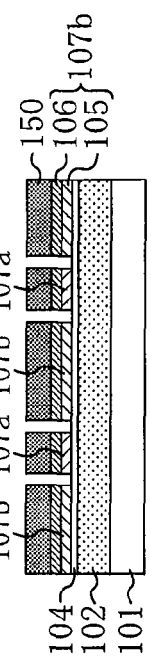
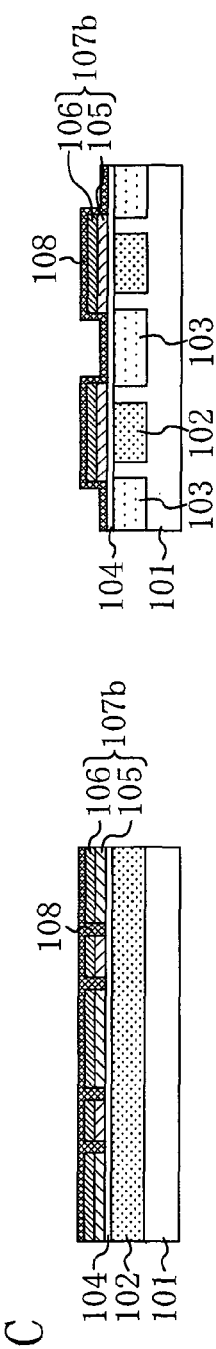
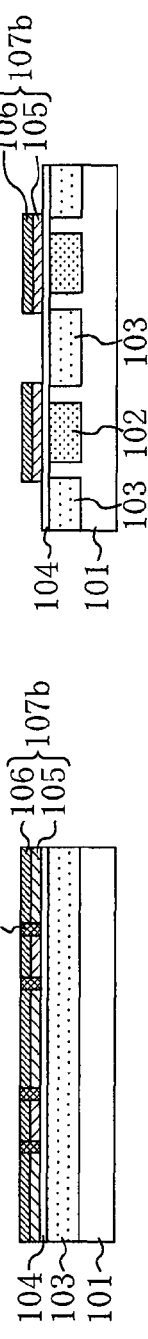
FIG. 6A
FIG. 6B
FIG. 6C
FIG. 6D

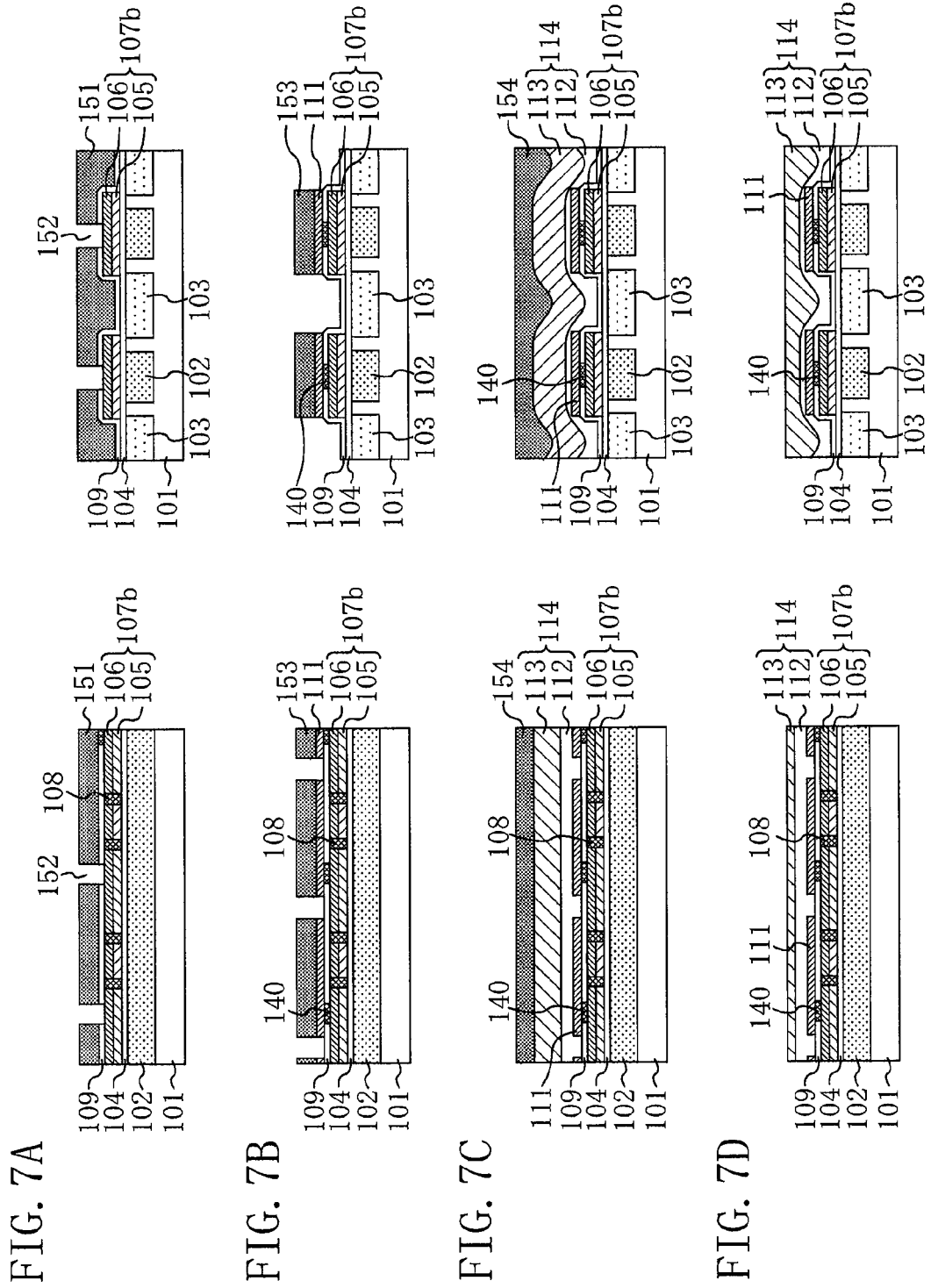

US 8,314,450 B2

SOLID-STATE IMAGING DEVICE AND METHOD FOR MANUFACTURING SAME

CROSS-REFERENCE TO RELATED APPLICATION

This is a continuation of PCT International Application PCT/JP2008/004024 filed on Dec. 26, 2008, which claims priority to Japanese Patent Application No. 2008-56283 filed on Mar. 6, 2008. The disclosures of these applications including the specifications, the drawings, and claims are hereby incorporated by reference in their entirety.

BACKGROUND

The present disclosure relates to solid-state imaging devices, and more particularly, to charge coupled device (CCD) type solid-state imaging devices.

In recent years, with the rapid proliferation of digital cameras, digital video/still cameras, and camera-equipped mobile phones, demand for solid-state imaging devices has been rapidly growing. Recently, in particular, with the need for increase in the number of pixels and adaptation to moving pictures, solid-state imaging devices achieving a balance between finer pixel size and higher drive speed have been in high demand. As one solution answering this request, proposed is a low-resistance transfer electrode structure in which a transfer electrode is constructed of a multilayer film of a high-resistance electrode film made of polysilicon or the like and a low-resistance electrode film made of aluminum, tungsten, silicide, or the like (see Japanese Patent No. 3255116 (Document 1), for example).

A basic structure of a conventional solid-state imaging device will be described.

FIG. 9 is a view schematically showing the entire configuration of a conventional solid-state imaging device.

The conventional solid-state imaging device of FIG. 9 includes a plurality of pixels 2 arranged in a matrix (in rows and columns in the horizontal and vertical directions) with spacing from one another on a semiconductor substrate 1 made of an n-type silicon substrate. The region having the pixels 2 arranged in a matrix constitutes an image formation region 3.

The plurality of pixels 2 include a plurality of vertical transfer channels 4 extending in the vertical (column) direction and a plurality of photodiodes 5 arranged in a matrix with each column of photodiodes 5 being adjacent to each of the vertical transfer channels 4. A horizontal transfer channel 6 extending in the horizontal (row) direction is also formed on the semiconductor substrate 1 at the ends of the vertical transfer channels 4 in the transfer direction (vertical direction). An output amplifier 7 is provided at the output end of the horizontal transfer channel 6. The arrows a to c in FIG. 9 indicate the charge transfer directions.

In a region surrounding the image formation region 3, a plurality of vertical bus lines 8 run along the periphery of the image formation region 3, and different transfer pulses φV1 to φV4 are supplied to the different vertical bus lines 8 from outside. Also, a plurality of horizontal bus lines 9 run along the horizontal transfer channel 6, and different transfer pulses φH1 and φH2 are supplied to the different horizontal bus lines 9 from outside.

A plurality of vertical transfer electrodes 10 extend in the horizontal direction above the vertical transfer channels 4, and are connected to any of the vertical bus lines 8 at their both ends. Likewise, a plurality of horizontal transfer electrodes 11 are formed above the horizontal transfer channels 6, and are connected to any of the horizontal bus lines 9 at their ends.

The configuration of each pixel of the solid-state imaging device of FIG. 9 will be described in a concrete manner.

FIG. 10 is a cross-sectional view of a pixel shown in FIG. 9 in the vertical direction.

As shown in FIG. 10, a plurality of vertical transfer channels 22 extending in the column direction and a plurality of photodiodes (PD) 23 arranged in a matrix with spacing from one another are formed in a surface portion of a semiconductor substrate 21. A gate insulating film 24 is formed on the entire surface of the semiconductor substrate 21 to cover the vertical transfer channels 22 and the photodiodes 23. A plurality of vertical transfer electrodes 27, each constructed of a gate electrode 25 and a metal light-shielding film 26, are formed on the gate insulating film 24 so as to expose part of each of the photodiodes 23 while covering the vertical transfer channels 22. An interlayer insulating film 28 is formed on the gate insulating film 24 to cover the vertical transfer electrodes 27 and have recesses formed above the photodiodes 23, and a high refractive-index film 29 is formed on the interlayer insulating film 28. The interlayer insulating film 28 and the high refractive-index film 29 constitute inner lenses 30. A flattening film 31 is formed on the high refractive-index film 29, and color filters 32 are formed on the flattening film 31. Another flattening film 33 is formed on the color filters 32, and top lenses 34 are formed on the flattening film 33. In the pixel structure configured as described above, light L condensed by each top lens 34 is incident on the opening above each photodiode 23 via the corresponding inter lens 30.

Next, the pixel structure of a solid-state imaging device of the first prior art example described in Document 1 above will be described.

FIGS. 11A-11E are a plan view (FIG. 11A), horizontal cross-sectional views (FIGS. 11D and 11E), and vertical cross-sectional views (FIGS. 11B and 11C) showing the pixel structure of the solid-state imaging device of the first prior art example, where the cross-sectional views of FIGS. 11B-11E are respectively taken along line XIb-XIb, line XIc-XIc, line XId-XId, and line XIe-XIe in the plan view of FIG. 11A. Note that illustration of the components shown in the cross-sectional views is partly omitted in the plan view of FIG. 11A for the sake of convenience.

As shown in FIGS. 11A-11E, in the pixel structure of the solid-state imaging device of the first prior art example, a plurality of vertical transfer channels 42 extending vertically and a plurality of photodiodes (PD) 43 arranged in a matrix are formed in a surface portion of a semiconductor substrate 41. A gate insulating film 44 is formed on the entire surface of the semiconductor substrate 41 to cover the vertical transfer channels 42 and the photodiodes 43. On the gate insulating film 44, a plurality of first and second vertical transfer electrodes 47a and 47b, each of which is constructed of a gate electrode 45 and a metal light-shielding film 46 made of tungsten, aluminum, silicide, salicide, or the like, are formed alternately in the vertical direction in such a manner as to expose part of each of the photodiodes 43 while covering the vertical transfer channels 42. A light-shielding resin 48 is formed in the gaps between the first vertical transfer electrodes 47a and the second vertical transfer electrodes 47b and on the sidewalls of the first and second vertical transfer electrodes 47a and 47b exposed in openings 43R (see FIG. 11A) formed to expose the photodiodes 43.

An interlayer insulating film 49 is formed on the gate insulating film 44 to cover the first and second vertical transfer electrodes 47a and 47b and have recesses formed above the photodiodes 43, and a high refractive-index film 50 having a refractive index higher than the interlayer insulating film 49 is formed on the interlayer insulating film 49. The interlayer insulating film 49 and the high refractive-index film 50 constitute inner lenses 51. Although not shown, a flattening film, color filters, another flattening film, and top lenses are formed in this order on the high refractive-index film 50 as those shown in FIG. 10.

The pixel structure of a solid-state imaging device of the second prior art example described in Document 1 will then be described.

FIGS. 12A-12C are a plan view (FIG. 12A) and horizontal cross-sectional views (FIGS. 12B and 12C) showing the pixel structure of the solid-state imaging device of the second prior art example, where the cross-sectional views of FIGS. 12B and 12C are respectively taken along line XIIb-XIIb and line XIIc-XIIc in the plan view of FIG. 12A. Note that illustration of the components shown in the cross-sectional views is partly omitted in the plan view of FIG. 12A for the sake of convenience. Note also that the vertical cross-sectional views of FIGS. 11B and 11C also apply to the solid-state imaging device of the second prior art example.

The solid-state imaging device of the second prior art example shown in FIGS. 12A-12C is the same in pixel structure as the solid-state imaging device of the first prior art example except for the regions where the light-shielding resin 48 is formed. More specifically, the light-shielding resin 48 in the solid-state imaging device of the second prior art example is not formed on the sidewalls of the first and second vertical transfer electrodes 47a and 47b exposed in the openings 43R (see FIGS. 12A and 12B). Moreover, the regions of the light-shielding resin 48 formed in the gaps between the first and second vertical transfer electrodes 47a and 47b recede inward at portions exposed in the openings 43R (see FIGS. 12A and 12C).

SUMMARY

The pixel structure of the solid-state imaging device of the first prior art example described above has problems itemized under 1) to 3) as follows. 1) As shown in FIGS. 11A, 11C, and 11D, since the light-shielding resin 48 is formed on the sidewalls of the first and second vertical transfer electrodes 47a and 47b exposed in the openings 43R, the area of each opening 43R is narrow and thus the sensitivity decreases. 2) As shown in FIGS. 11B-11E, since the height of the first and second vertical transfer electrodes 47a and 47b with respect to the bottoms of the openings 43R is low, the curvature of the inner lenses is small. Therefore, the light condensing power of the inner lenses 51 is weak, allowing spread of incident light. This causes light leakage into the vertical transfer channels 42, increasing smears. 3) As shown in FIGS. 11A, 11B, and 11D, the light-shielding resin 48 with which the gaps between the first and second vertical transfer electrodes 47a and 47b is filled is generally low in light shielding effect compared with metal light-shielding films. Therefore, the light-shielding resin 48 allows transmission of intense light such as sunlight, which then leak into the vertical transfer channels 42, causing increase of smears.

In the pixel structure of the solid-state imaging device of the second prior art example described above, as shown in FIGS. 12A and 12B, since the light-shielding resin 48 is not formed on the sidewalls of the first and second vertical transfer electrodes 47a and 47b exposed in the openings 43R, the area of each opening 43R is wide compared with the case of the solid-state imaging device of the first prior art example, and thus the sensitivity improves as illustrated by an area 12b. Although the solid-state imaging device of the second prior art example can solve the problem 1) of the solid-state imaging device of the first prior art example as described above, it cannot solve the problems 2) and 3). Moreover, the pixel structure of the solid-state imaging device of the second prior art example has a new problem as follows. Because the regions of the light-shielding resin 48 formed in the gaps between the first and second vertical transfer electrodes 47a and 47b recede inward at portions exposed in the openings 43R as shown in FIG. 12C, incident light is easy to enter the vertical transfer channels 42 at regions 12c through the ends of the gaps between the first and second vertical transfer electrodes 47a and 47b, causing increase of smears.

In view of the above, it is an objective of the present invention to provide a solid-state imaging device that is excellent in the quality of taken images and has a structure permitting high-speed operation by enhancing the sensitivity and reducing smears, and a method for manufacturing such a solid-state imaging device.

To attain the above objective, the solid-state imaging device of an embodiment of the present invention includes: a semiconductor substrate having, in its surface portion, a plurality of vertical transfer channel regions extending vertically and a plurality of photoelectric conversion regions arranged in a matrix with spacing from one another and lined to be adjacent to each of the plurality of vertical transfer channel regions; a plurality of vertical transfer electrodes, each constructed of a gate electrode and a first metal light-shielding film, formed on the semiconductor substrate via a gate insulating film so as to expose the plurality of photoelectric conversion regions and extend horizontally with spacing from one another; a transparent insulating film formed in gaps existing between the plurality of vertical transfer electrodes above the plurality of vertical transfer channel regions; and a second metal light-shielding film formed on the plurality of vertical transfer electrodes and the transparent insulating film via a first interlayer insulating film to cover at least the plurality of vertical transfer channel regions.

In the solid-state imaging device of an embodiment of the present invention, the transparent insulating film may also be formed on sidewalls of the plurality of vertical transfer electrodes exposed in the plurality of photoelectric conversion regions.

In the solid-state imaging device of an embodiment of the present invention, the second metal light-shielding film may further be formed above regions between any vertically adjacent photoelectric conversion regions.

In the solid-state imaging device of an embodiment of the present invention, the plurality of vertical transfer electrodes may include first vertical transfer electrodes extending horizontally passing above regions between any vertically adjacent photoelectric conversion regions and second vertical transfer electrodes also serving as read electrodes formed above regions between any horizontally adjacent photoelectric conversion regions, the first and second vertical transfer electrodes being adjacent to each other, the second vertical transfer electrodes may be electrically connected to the second metal light-shielding film, and the first vertical transfer electrodes may be formed under the second metal light-shielding film.

In the solid-state imaging device of an embodiment of the present invention, gaps between the first vertical transfer electrodes and the second vertical transfer electrodes may be located on upstream and downstream sides of the regions between any horizontally adjacent photoelectric conversion regions in the vertical direction.

In the solid-state imaging device of an embodiment of the present invention, the second metal light-shielding film may be vertically divided into a plurality of portions, and the first vertical transfer electrodes and the second vertical transfer electrodes may be formed so that gaps between any adjacent portions of the second metal light-shielding film are located in the center portions of the regions between any horizontally adjacent photoelectric conversion regions.

In the solid-state imaging device of an embodiment of the present invention, the second vertical transfer electrodes may be formed separately like islands.

In the solid-state imaging device of an embodiment of the present invention, the transparent insulating film may be made of silicon nitride.

The solid-state imaging device of an embodiment of the present invention may further include: a second interlayer insulating film formed to cover the second metal light-shielding film and have recesses above the plurality of photoelectric conversion regions; and a high refractive-index film having a refractive index higher than the second interlayer insulating film, formed on the second interlayer insulating film.

The solid-state imaging device of an embodiment of the present invention may further include: color filters formed on the high refractive-index film; and top lenses formed on the color filters.

A method for manufacturing a solid-state imaging device of an embodiment of the present invention includes the steps of: (a) forming, in a surface portion of a semiconductor substrate, a plurality of vertical transfer channel regions extending vertically and a plurality of photoelectric conversion regions arranged in a matrix with spacing from one another and lined to be adjacent to each of the plurality of vertical transfer channel regions; (b) forming a plurality of vertical transfer electrodes, each constructed of a gate electrode and a first metal light-shielding film, on the semiconductor substrate via a gate insulating film so as to expose each of the plurality of photoelectric conversion regions and extend horizontally with spacing from one another; (c) forming a transparent insulating film in gaps existing between the plurality of vertical transfer electrodes above the plurality of vertical transfer channel regions; and (d) forming a second metal light-shielding film on the plurality of vertical transfer electrodes and the transparent insulating film via a first interlayer insulating film to cover at least the plurality of vertical transfer channel regions.

In the method for manufacturing a solid-state imaging device of an embodiment of the present invention, the step (c) may include a step of forming the transparent insulating film by depositing a transparent insulating film material on the entire surface of the semiconductor substrate and then subjecting the transparent insulating film material to isotropic etching to allow the transparent insulating film material to remain in gaps existing between the plurality of vertical transfer electrodes above the plurality of vertical transfer channel regions.

In the method for manufacturing a solid-state imaging device of an embodiment of the present invention, the step (c) may include a step of forming the transparent insulating film by depositing a transparent insulating film material on the entire surface of the semiconductor substrate and then subjecting the transparent insulating film material to anisotropic etching to allow the transparent insulating film material to remain in gaps existing between the plurality of vertical transfer electrodes above the plurality of vertical transfer channel regions and also remain on sidewalls of the plurality of vertical transfer electrodes exposed in the plurality of photoelectric conversion regions.

In the method for manufacturing a solid-state imaging device of an embodiment of the present invention, the step (d) may include a step of further forming the second metal light-shielding film above regions between any vertically adjacent photoelectric conversion regions.

In the method for manufacturing a solid-state imaging device of an embodiment of the present invention, the step (b) may include a step of forming the plurality of vertical transfer electrodes including first vertical transfer electrodes extending horizontally passing above regions between any vertically adjacent photoelectric conversion regions and second vertical transfer electrodes also serving as read electrodes formed above regions between any horizontally adjacent photoelectric conversion regions, the first and second vertical transfer electrodes being adjacent to each other, and the step (d) may include a step of forming the second metal light-shielding film to be electrically connected to the second vertical transfer electrodes via contact holes formed through the first interlayer insulating film and cover the first vertical transfer electrodes.

In the method for manufacturing a solid-state imaging device of an embodiment of the present invention, the step (b) may be performed so that gaps between the first vertical transfer electrodes and the second vertical transfer electrodes are located on upstream and downstream sides of the regions between any horizontally adjacent photoelectric conversion regions in the vertical direction.

In the method for manufacturing a solid-state imaging device of an embodiment of the present invention, the step (d) may include a step of forming the second metal light-shielding film vertically divided into a plurality of portions, and in the step (b), the first vertical transfer electrodes and the second vertical transfer electrodes may be formed so that gaps between any adjacent portions of the second metal light-shielding film are located in the center portions of the regions between any horizontally adjacent photoelectric conversion regions.

The method for manufacturing a solid-state imaging device of an embodiment of the present invention may further include the steps of: (e) forming a second interlayer insulating film on the semiconductor substrate to cover the second metal light-shielding film and have recesses above the plurality of photoelectric conversion regions, after the step (d); and (f) forming a high refractive-index film having a refractive index higher than the second interlayer insulating film on the second interlayer insulating film.

The method for manufacturing a solid-state imaging device of an embodiment of the present invention may further include the steps of: (g) forming color filters on the high refractive-index film; and (h) forming top lenses on the color filters.

According to the present invention, a solid-state imaging device that is excellent in the quality of taken images and permits high-speed operation with enhanced sensitivity and reduced smears is implemented.

BRIEF DESCRIPTION OF THE DRAWINGS

FIGS. 6A-6D are cross-sectional views showing a sequence of steps of a method for manufacturing a solid-state imaging device of the third embodiment of the present invention.

FIGS. 7A-7D are cross-sectional views showing a subsequent sequence of steps of the method for manufacturing a solid-state imaging device of the third embodiment of the present invention.

DETAILED DESCRIPTION

Embodiments of the present invention will be described hereinafter with reference to the accompanying drawings.

First Embodiment

Figure 1A:
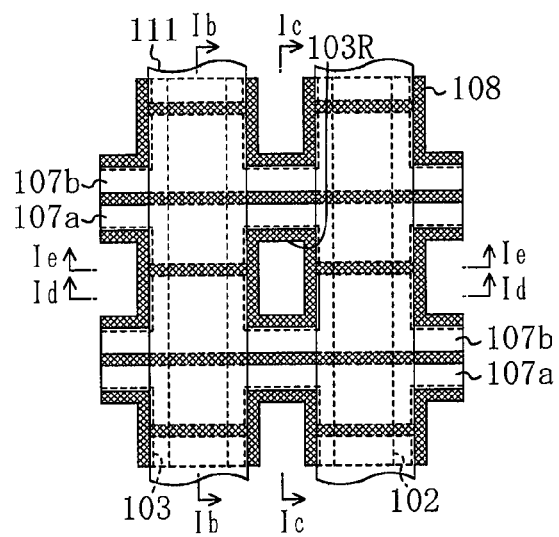
FIGS. 1A-1E are a plan view (FIG. 1A), horizontal cross-sectional views (FIGS. 1D and 1E), and vertical cross-sectional views (FIGS. 1B and 1C) showing a pixel structure of a solid-state imaging device of the first embodiment of the present invention.
Figure 9:
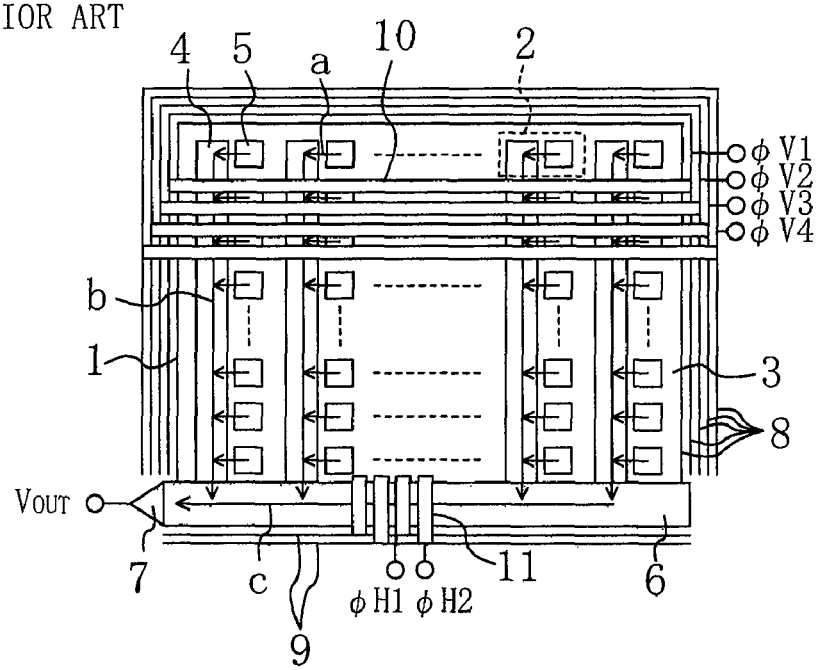
FIG. 9 is a view schematically showing the entire configuration of a conventional solid-state imaging device.

FIGS. 1A-1E are a plan view (FIG. 1A), horizontal cross-sectional views (FIGS. 1D and 1E), and vertical cross-sectional views (FIGS. 1B and 1C) showing a pixel structure of a solid-state imaging device of the first embodiment of the present invention, where the cross-sectional views of FIGS. 1B-1E are respectively taken along line Ib-Ib, line Ic-Ic, line Id-Id, and line Ie-Ie in the plan view of FIG. 1A. Note that illustration of the components shown in the cross-sectional views is partly omitted in the plan view of FIG. 1A for the sake of convenience. The basic configuration of the solid-state imaging device is the same as that described above with reference to FIG. 9, and thus description thereof is omitted in this embodiment.

As shown in FIGS. 1A-1E, in the pixel structure of the solid-state imaging device of this embodiment, a plurality of vertical transfer channels 102 extending vertically and a plurality of photodiodes (PD, photoelectric conversion regions) 103 arranged in a matrix are formed in a surface portion of a semiconductor substrate 101. A gate insulating film 104 is formed on the entire surface of the semiconductor substrate 101 to cover the vertical transfer channels 102 and the photodiodes 103. On the gate insulating film 104, a plurality of first and second vertical transfer electrodes 107a and 107b, each of which is constructed of a gate electrode 105 and a metal light-shielding film 106 made of tungsten, aluminum, silicide, salicide, or the like, are formed alternately in the vertical direction in such a manner as to expose part of each of the photodiodes 103 while covering the vertical transfer channels 102. A transparent insulating film 108 made of an oxide film (e.g., a silicon oxide film) or a nitride film (e.g., a silicon nitride film) is formed in the gaps between the first vertical transfer electrodes 107a and the second vertical transfer electrodes 107b and on the sidewalls of the first and second vertical transfer electrodes 107a and 107b exposed in openings 103R (see FIG. 1A) formed to expose the photodiodes 103. The transparent insulating film 108 is formed by anisotropic etching.

An interlayer insulating film 109 is formed on the gate insulating film 104 to cover the first and second vertical transfer electrodes 107a and 107b, and a metal light-shielding film 111 is formed on the interlayer insulating film 109 to cover the vertical transfer channels 102. An interlayer insulating film 112 is formed on the interlayer insulating film 109 to cover the metal light-shielding film 111 and have recesses formed above the photodiodes 103. A high refractive-index film 113 having a refractive index higher than the interlayer insulating film 112 is formed on the interlayer insulating film 112. The interlayer insulating film 112 and the high refractive-index film 113 constitute inner lenses 114. Although not shown, a flattening film, color filters, another flattening film, and top lenses are formed in this order on the high refractive-index film 113 (see FIG. 10 discussed above, for example).

In the solid-state imaging device of this embodiment having the pixel structure described above, as shown in FIGS. 1A and 1C-1E, the transparent insulating film 108 made of an oxide film (e.g., a silicon oxide film) or a nitride film (e.g., a silicon nitride film), not the light-shielding resin in the first prior art example, is formed on the sidewalls of the first and second vertical transfer electrodes 107a and 107b exposed in the openings 103R formed to expose the photodiodes 103. Therefore, since the size of the openings 103R for the photodiodes 103 is virtually determined by the first and second vertical transfer electrodes 107a and 107b and the metal light-shielding film 111, it is virtually wide compared with that in the first prior art example. This improves the sensitivity compared with that in the first prior art example.

Figure 1B:
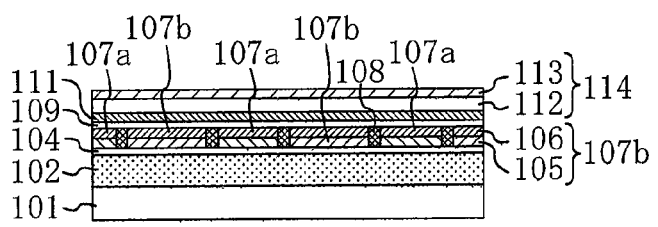
Figure 1C:
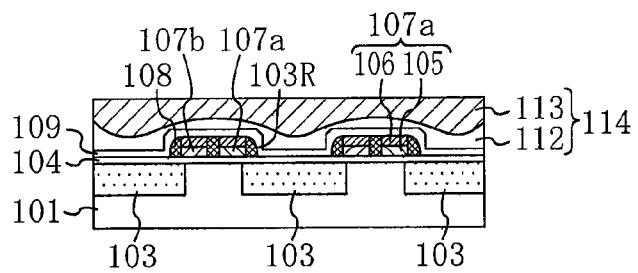
Figure 1D:
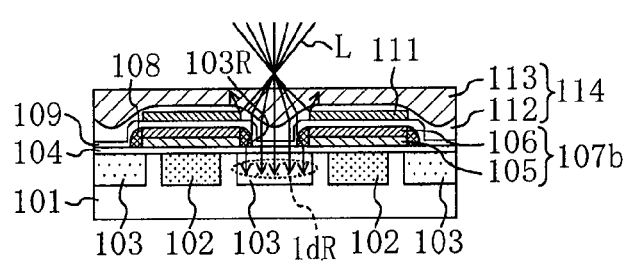
Figure 1E:
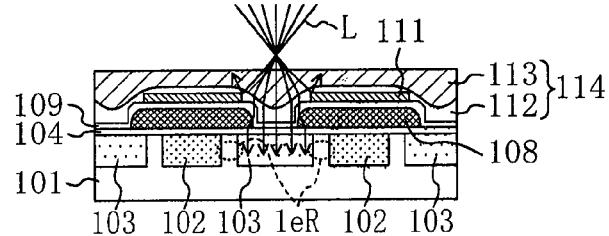

Also, as shown in FIGS. 1D and 1E, with the metal light-shielding film 111 formed on the first and second vertical transfer electrodes 107a and 107b, the height from the top of the metal light-shielding film 111 to the photodiodes 103 increases compared with the case of the first prior art example. Therefore, the interlayer insulating film 112 constituting the inner lenses 114 has deep recesses formed above the photodiodes 103 compared with the case of the first prior art example. This increases the curvature of the inner lenses 114 constructed of the interlayer insulating film 112 and the high refractive-index film 113. As a result, as shown by a region 1dR in FIG. 1D, the light condensing power of the inner lenses 114 increases, reducing spread of incident light L and thus reducing occurrence of smears compared with the case of the first prior art example.

Moreover, as shown in FIGS. 1A and 1C-1E, the metal light-shielding film 111 higher in light shielding effect than the light-shielding resin used in the first prior art example is formed above the gaps between the first and second vertical transfer electrodes 107a and 107b. Therefore, even if intense light such as sunlight is incident, transmission of the light is reduced. In this way, in this embodiment, since light transmitted to regions 1eR in FIG. 1E, for example, is reduced compared with the case of the first prior art example, occurrence of smears is reduced compared with the case of the first prior art example.

Furthermore, when a nitride film high in permittivity, such as a silicon nitride film, is used as a material constituting the transparent insulating film 108, electrical gaps between the first vertical transfer electrodes 107a and the second vertical transfer electrodes 107b are narrowed in the section shown in FIG. 1B. Thus; degradation in transfer efficiency, caused by the gaps between the first and second vertical transfer electrodes 107a and 107b, can be reduced.

First Variation of First Embodiment

Next, a pixel structure of a solid-state imaging device of the first variation of this embodiment will be described.

Figure 2A:
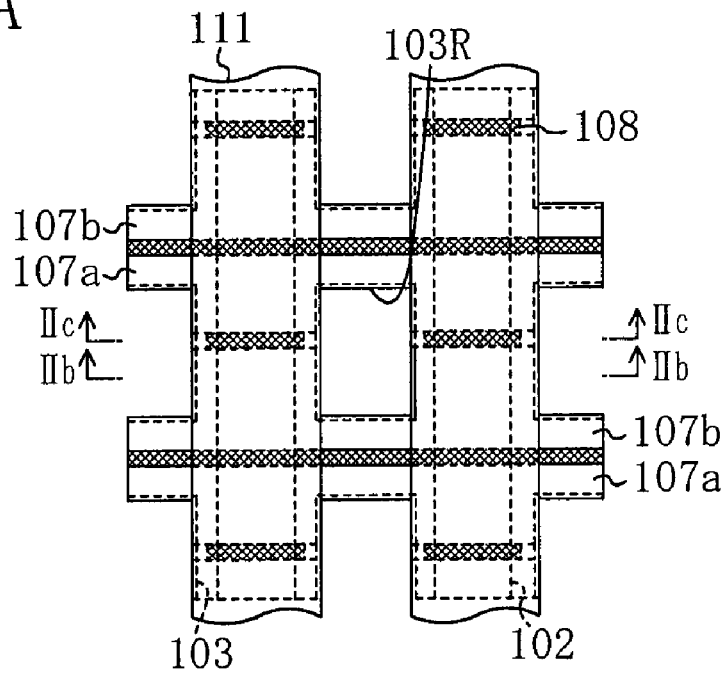
FIGS. 2A-2C are a plan view (FIG. 2A) and horizontal cross-sectional views (FIGS. 2B and 2C) showing a pixel structure of a solid-state imaging device of the first variation of the first embodiment.
Figure 2B:
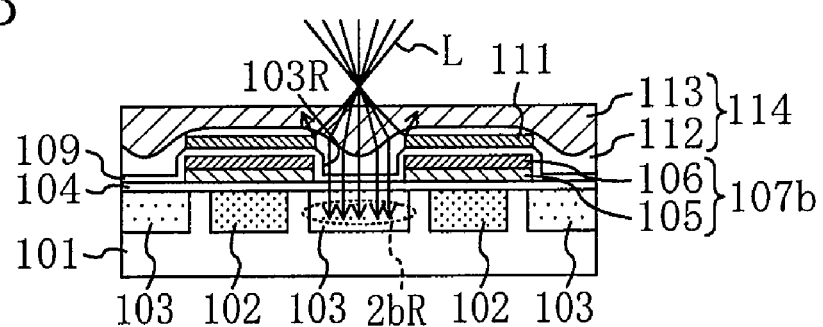
Figure 2C:
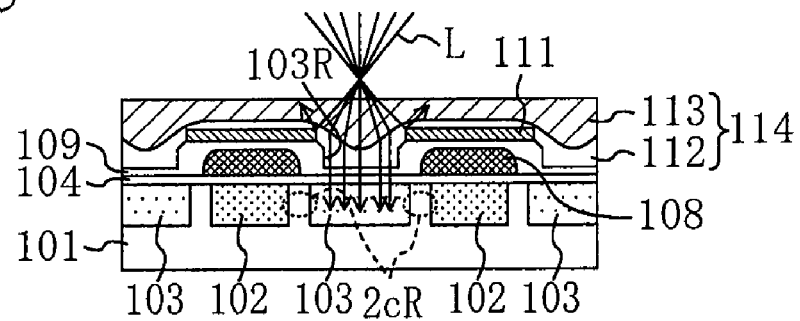

FIGS. 2A-2C are a plan view (FIG. 2A) and horizontal cross-sectional views (FIGS. 2B and 2C) showing the pixel structure of the solid-state imaging device of the first variation of this embodiment, where the cross-sectional views of FIGS. 2B and 2C are respectively taken along line IIb-IIb and line IIc-IIc in the plan view of FIG. 2A. Note that illustration of the components shown in the cross-sectional views is partly omitted in the plan view of FIG. 2A for the sake of convenience. Note also that the vertical cross-sectional view of FIG. 1B also applies to the solid-state imaging device of this variation, and that a structure in which no transparent insulating film exists on the sidewalls of the first and second vertical transfer electrodes 107a and 107b in the vertical cross-sectional view of FIG. 1C corresponds to the cross-sectional structure of the solid-state imaging device of this variation.

The solid-state imaging device of the first variation shown in FIGS. 2A-2C is the same in pixel structure as the solid-state imaging device shown in FIGS. 1A-1E except for the regions where the transparent insulating film 108 is formed. More specifically, in the solid-state imaging device of the first variation, the transparent insulating film 108 is not formed on the sidewalls of the first and second vertical transfer electrodes 107a and 107b exposed in the openings 103R as shown in FIGS. 2A-2C. Moreover, the regions of the transparent insulating film 108 formed in the gaps between the first and second vertical transfer electrodes 107a and 107b recede inward at portions exposed in the openings 103R (see FIG. 2C). The transparent insulating film 108 is formed by isotropic etching.

In the solid-state imaging device of the first variation having the pixel structure described above, as shown in FIGS. 2A and 2C, while the regions of the transparent insulating film 108 formed in the gaps between the first and second vertical transfer electrodes 107a and 107b recede inward at portions exposed in the openings 103R, the gaps between the first and second vertical transfer electrodes 107a and 107b are shaded by the metal light-shielding film 111. Therefore, the problem that incident light may be easy to enter the vertical transfer channels 102 at regions 2cR, for example, through the ends of the gaps between the first and second vertical transfer electrodes 107a and 107b is avoided, and thus occurrence of smears is reduced compared with the case of the second prior art example.

Also, as shown in FIG. 2B, since the transparent insulating film 108 is not formed on the sidewalls of the first and second vertical transfer electrodes 107a and 107b exposed in the openings 103R by using isotropic etching, light is incident vertically as shown in a region 2bR, for example, without causing the problem that light incident on edges of the transparent insulating film 108 may be refracted and spread inside the semiconductor substrate 101 (see FIGS. 1D and 1E), even if a material high in permittivity such as a nitride film (e.g., a silicon nitride film) is used as the transparent insulating film 108 for improvement of the transfer efficiency. Therefore, compared with the case of using a high-permittivity material as the transparent insulating film 108 in the solid-state imaging device shown in FIGS. 1A-1E, occurrence of smears is further reduced.

Second Variation of First Embodiment

Next, a pixel structure of a solid-state imaging device of the second variation of this embodiment will be described.

Figure 3A:
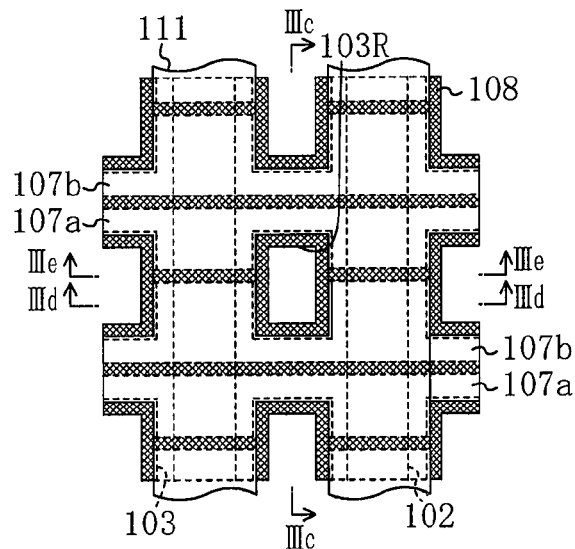
FIGS. 3A and 3C-3E are a plan view (FIG. 3A), a vertical cross-sectional view (FIG. 3C), and horizontal cross-sectional views (FIGS. 3D and 3E) showing a pixel structure of a solid-state imaging device of the second variation of the first embodiment.
Figure 3B:
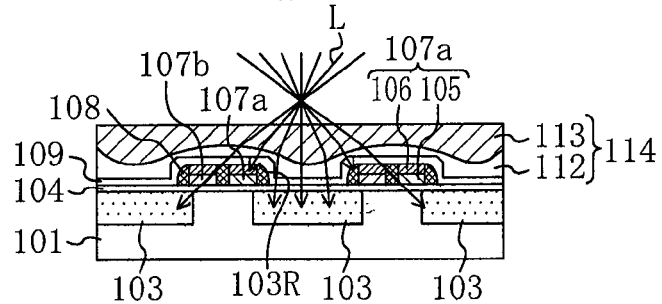
FIG. 3B is a vertical cross-sectional view as a comparative example for the second variation.
Figure 3C:
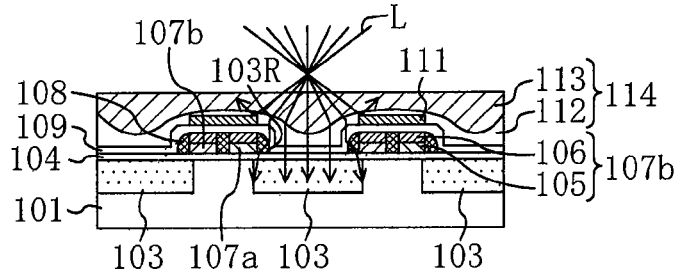
Figure 3D:
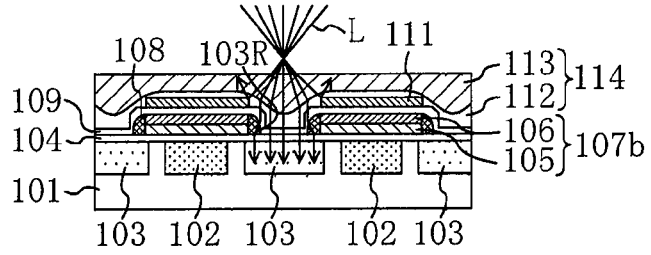
Figure 3E:
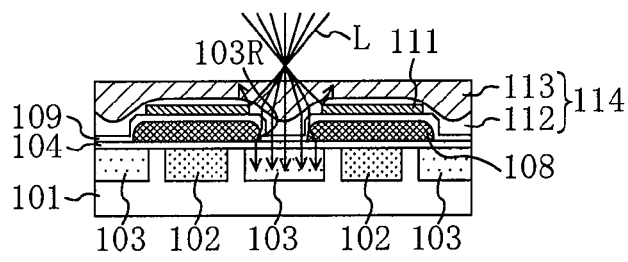

FIGS. 3A and 3C-3E are a plan view (FIG. 3A), a vertical cross-sectional view (FIG. 3C), and horizontal cross-sectional views (FIGS. 3D and 3E) showing a pixel structure of a solid-state imaging device of the second variation of this embodiment, where the cross-sectional views of FIGS. 3C-3E are respectively taken along line IIIc-IIIc, line IIId-IIId, and line in the plan view of FIG. 3A. Note that illustration of the components shown in the cross-sectional views is partly omitted in the plan view of FIG. 3A for the sake of convenience. Note also that the vertical cross-sectional view of FIG. 1B also applies to the solid-state imaging device of this variation, and that the horizontal cross-sectional views of FIGS. 3D and 3E are the same as the horizontal cross-sectional views of FIGS. 1D and 1E. FIG. 3B is a vertical cross-sectional view presented as a comparative example to the second variation, in which incident light L is additionally depicted in the vertical cross-sectional view of FIG. 1C.

The solid-state imaging device of the second variation shown in FIGS. 3A and 3C-3E is the same in pixel structure as the solid-state imaging device shown in FIGS. 1A-1E except for the regions where the metal light-shielding film 111 is formed. More specifically, in the solid-state imaging device of the second variation, the metal light-shielding film 111 is formed, not only above the vertical transfer channels 102, but also above vertical pixel isolation regions that are regions located between any vertically adjacent photodiodes 103.

In the solid-state imaging device of the second variation having the pixel structure described above, as shown in FIGS. 3A and 3C, with the metal light-shielding film 111 formed also above the vertical pixel isolation regions, the gaps between the first and second vertical transfer electrodes 107a and 107b above the vertical pixel isolation regions are shaded. When the metal light-shielding film 111 is not formed above the vertical pixel isolation regions like the structure shown in FIG. 1C, marginal slanting rays of the incident light may pass through the gaps between the first and second vertical transfer electrodes 107a and 107b located above the vertical isolation portions and over the first and second vertical transfer electrodes 107a and 107b located above the vertical isolation portions, to enter the adjacent photodiodes 103, as shown in FIG. 3B, causing crosstalk. In the second variation, however, this occurrence of crosstalk is reduced.

Also, as shown in FIG. 3C, with the metal light-shielding film 111 formed, not only above the vertical transfer channels 102, but also above the vertical pixel isolation regions, the height of the walls of the openings 103R on the sides adjacent to the vertical pixel isolation regions with respect to the photodiodes 103 increases. This further increases the curvature of the inner lenses 114, and as a result, the light condensing power of the inner lenses 114 increases, reducing vignetting of the incident light L. Thus, the sensitivity and the light incident angle characteristic improve compared with those in the solid-state imaging device shown in FIGS. 1A-1E.

Note that although the structure of the solid-state imaging device shown in FIGS. 1A-1E was used to change the shape of the metal light-shielding film 111 in the second variation, this change can also be applied to the first variation shown in FIGS. 2A-2C, whereby the effects of reducing crosstalk and improving the sensitivity can be obtained.

Second Embodiment

Figure 4A:
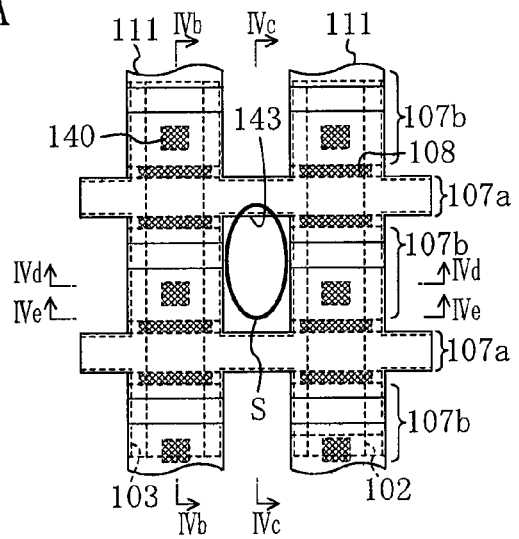
FIGS. 4A-4E are a plan view (FIG. 4A), horizontal cross-sectional views (FIGS. 4D and 4E), and vertical cross-sectional views (FIGS. 4B and 4C) showing a pixel structure of a solid-state imaging device of the second embodiment of the present invention.
Figure 4B:
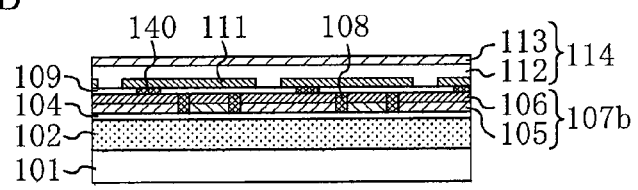

FIGS. 4A-4E are a plan view (FIG. 4A), horizontal cross-sectional views (FIGS. 4D and 4E), and vertical cross-sectional views (FIGS. 4B and 4C) showing a pixel structure of a solid-state imaging device of the second embodiment of the present invention, where the cross-sectional views of FIGS. 4B-4E are respectively taken along line IVb-IVb, line IVc-IVc, line IVd-IVd, and line IVe-IVe in the plan view of FIG. 4A. Note that illustration of the components shown in the cross-sectional views is partly omitted in the plan view of FIG. 4A for the sake of convenience. The basic configuration of the solid-state imaging device is the same as that described above with reference to FIG. 9, and thus description thereof is omitted in this embodiment.

As shown in FIGS. 4A-4E, in the pixel structure of the solid-state imaging device of this embodiment, a plurality of vertical transfer channels 102 extending in the vertical direction and a plurality of photodiodes (PD) 103 arranged in a matrix are formed in a surface portion of a semiconductor substrate 101. A gate insulating film 104 is formed on the entire surface of the semiconductor substrate 101 to cover the vertical transfer channels 102 and the photodiodes 103. On the gate insulating film 104, a plurality of first and second vertical transfer electrodes 107a and 107b, each of which is constructed of a gate electrode 105 and a metal light-shielding film 106 made of tungsten, aluminum, silicide, salicide, or the like, are formed alternately in the vertical direction in such a manner as to expose part of each of the photodiodes 103 while covering the vertical transfer channels 102. The first vertical transfer electrodes 107a are formed to extend horizontally passing above vertical pixel isolation regions that are regions between any vertically adjacent photodiodes 103. The second vertical transfer electrodes 107b are formed individually as islands above regions between any horizontally adjacent photodiodes 103.

A transparent insulating film 108 made of an oxide film (e.g., a silicon oxide film) or a nitride film (e.g., a silicon nitride film) is formed in the gaps between the first vertical transfer electrodes 107a and the second vertical transfer electrodes 107b. By forming the transparent insulating film 108 by isotropic etching, regions of the transparent insulating film 108 formed in the gaps between the first and second vertical transfer electrodes 107a and 107b recede inward at portions exposed in openings 143.

An interlayer insulating film 109 is formed on the gate insulating film 104 to cover the first and second vertical transfer electrodes 107a and 107b. Contact holes are formed through the interlayer insulating film 109 and filled with a metal film to form contacts 140. A metal light-shielding film 111 is formed on the interlayer insulating film 109 to cover the vertical transfer channels 102, and are connected with the second vertical transfer electrodes 107b via the contacts 140. An interlayer insulating film 112 is formed on the interlayer insulating film 109 to cover the metal light-shielding film 111 and have recesses formed above the photodiodes 103. A high refractive-index film 113 having a refractive index higher than the interlayer insulating film 112 is formed on the interlayer insulating film 112. The interlayer insulating film 112 and the high refractive-index film 113 constitute inner lenses 114. Although not shown, a flattening film, color filters, another flattening film, and top lenses are formed in this order on the high refractive-index film 113 (see FIG. 10 discussed above, for example).

As described above, in the pixel structure of the solid-state imaging device of this embodiment shown in FIGS. 4A-4E, the metal light-shielding film 111 is connected to the second vertical transfer electrodes 107b via the contacts 140, so that transfer pulses are supplied to the second vertical transfer electrodes 107b via the metal light-shielding film 111. Also, since the second vertical transfer electrodes 107b are formed as individual islands that are adjacent to the photodiodes 103, the gaps between the first and second vertical transfer electrodes 107a and 107b are located on the upstream and downstream sides of the regions between any horizontally adjacent photodiodes 103.

In the solid-state imaging device of this embodiment having the pixel structure described above, as shown in FIG. 4A, the second vertical transfer electrodes 107b are formed to be adjacent to the center portions of the photodiodes 103. Therefore, the gaps between the first and second vertical transfer electrodes 107a and 107b are formed near the upstream and downstream ends of the regions between any horizontally adjacent photodiodes 103. Accordingly, as shown in FIG. 4E, for example, light hardly enters the gaps because it is marginal rays Le of the light condensed by the inner lens 114. As a result, in this embodiment, compared with the first embodiment, occurrence of smears due to light leakage to regions 4eR through the gap portions is widely reduced.

Figure 4C:
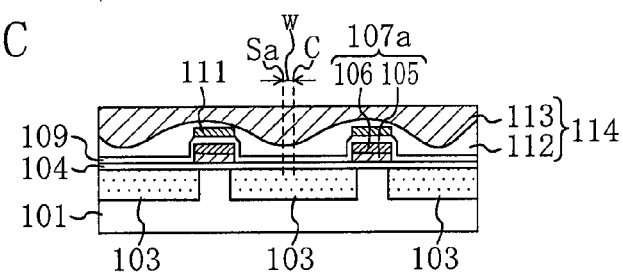
Figure 4D:
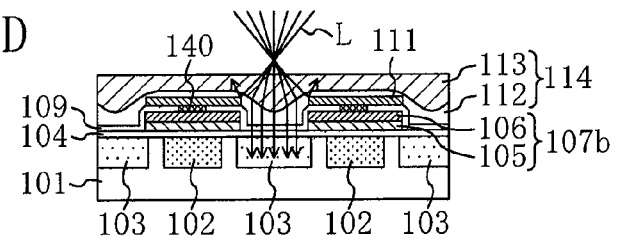
Figure 4E:
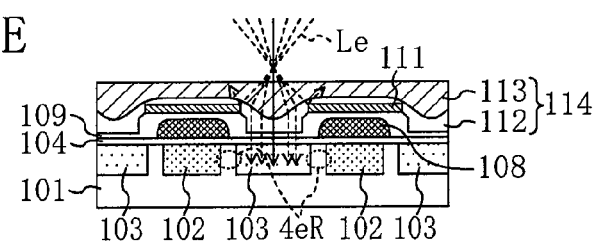

Also, as shown in FIGS. 4A and 4C, the metal light-shielding film 111 for supplying transfer pulses to the second vertical transfer electrodes 107b is formed to overlie the first vertical transfer electrodes 107a. Therefore, the line width of the vertical pixel isolation regions as the regions between any vertically adjacent photodiodes 103 can be reduced. As a result, the width of the openings 143 in the vertical direction can be widely increased, thereby further improving the sensitivity.

Moreover, as shown in FIGS. 4A and 4C, the first vertical transfer electrodes 107a are formed under the metal light-shielding film 111 in the regions above the vertical pixel isolation regions. Therefore, even when read pulses of a high voltage (12 V) are applied to the second vertical transfer electrodes 107b, the substrate portions of the vertical pixel isolation regions are avoided from being subjected to the electric field of the read pulses because the first vertical transfer electrodes 107a serve as shield electrodes. This permits stable read of signal charge from the photodiodes 103.

Variation of Second Embodiment

Next, a pixel structure of a solid-state imaging device of a variation of this embodiment will be described.

Figure 5A:
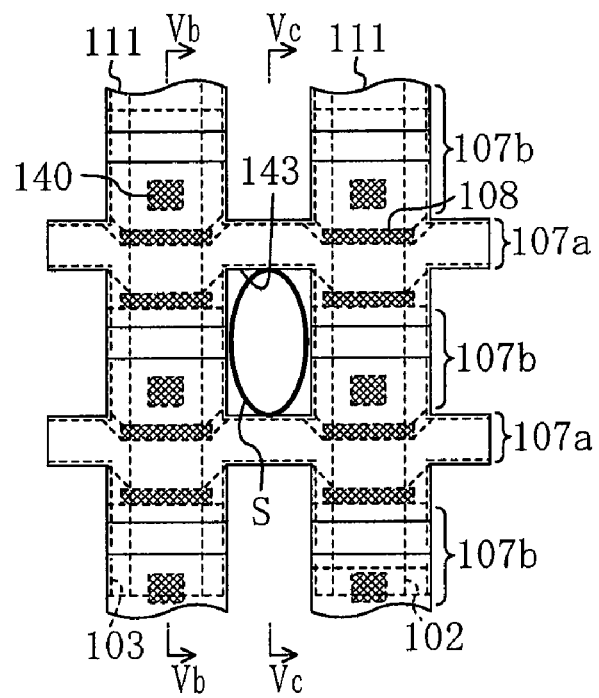
FIGS. 5A-5C are a plan view (FIG. 5A) and vertical cross-sectional views (FIGS. 5B and 5C) showing a pixel structure of a solid-state imaging device of a variation of the second embodiment.
Figure 5B:
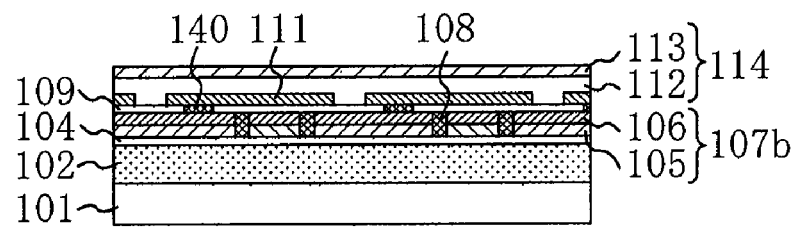
Figure 5C:
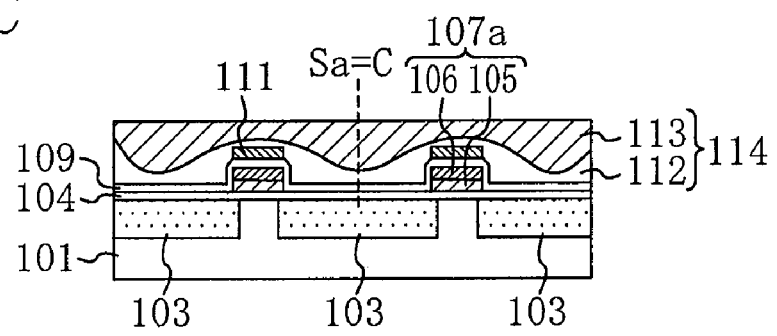

FIGS. 5A-5C are a plan view (FIG. 5A) and vertical cross-sectional views (FIGS. 5B and 5C) showing the pixel structure of the solid-state imaging device of the variation of this embodiment, where the cross-sectional views of FIGS. 5B and 5C are respectively taken along line Vb-Vb and line Vc-Vc in the plan view of FIG. 5A. Note that illustration of the components shown in the cross-sectional views is partly omitted in the plan view of FIG. 5A for the sake of convenience. Note also that the horizontal cross-sectional view of FIG. 4D also applies to the solid-state imaging device of this variation.

The solid-state imaging device of this variation shown in FIGS. 5A-5C is the same in pixel structure as the solid-state imaging device shown in FIGS. 4A-4E except for the positions of formation of the first and second vertical transfer electrodes 107a and 107b. More specifically, the first vertical transfer electrodes 107a are formed so that the portions thereof located above the vertical transfer channels 102 and the portions thereof located above the vertical pixel isolation regions are vertically displaced from each other. By this vertically displaced arrangement, the second vertical transfer electrodes 107b can also be displaced vertically. Therefore, in this variation, the positions of the gaps between the adjacent regions of the metal light-shielding film 111, which are connected to the second vertical transfer electrodes 107b via the contacts 140, located above the vertical transfer channels 102 are configured to be in the regions between any horizontally adjacent photodiodes 103 and approximately level with the center portions of the photodiodes 103.

In the solid-state imaging device of this variation having the pixel structure described above, in which the positions of the gaps between the adjacent regions of the metal light-shielding film 111 located above the vertical transfer channels 102 are in the regions between any horizontally adjacent photodiodes 103 and approximately level with the center portions of the photodiodes 103, the light-condensed spot S of each inner lens 114 is formed in the center of the pixel. Therefore, vignetting of incident light is reduced, further improving the sensitivity. In other words, while the center Sa of the light-condensed spot S is deviated from the center C of each pixel by a distance was shown in FIG. 4C in the pixel structure of the solid-state imaging device shown in FIGS. 4A-4C, the center Sa of the light-condensed spot S corresponds with the center C of each pixel as shown in FIG. 5C in the pixel structure of the solid-state imaging device of this variation. In this variation, therefore, the sensitivity further improves.

Third Embodiment

A method for manufacturing a solid-state imaging device of the third embodiment of the present invention will be described hereinafter.

FIGS. 6A-6D and 7A-7D are cross-sectional views showing a sequence of steps of the method for manufacturing a solid-state imaging device of the third embodiment of the present invention. In this embodiment, a method for manufacturing the solid-state imaging device having the pixel structure shown in FIGS. 4A-4E, among the solid-state imaging devices in the first and second embodiments, will be described as an example. Note that, in each of the FIGS. 6A-6D and 7A-7D, the left-side section as viewed from the figure is a vertical cross-sectional view corresponding to FIG. 4A, and the right-side section as viewed from the figure is a horizontal cross-sectional view corresponding to FIG. 4D. Although not specifically described, methods for manufacturing the solid-state imaging devices having the other pixel structures in the first and second embodiments are to be easily conceived from the manufacturing method described hereinbelow.

First, as shown in FIG. 6A, after formation of the vertical transfer channels 102 extending vertically and the photodiodes (PD) 103 arranged in a matrix in a surface portion of the semiconductor substrate 101, the gate insulating film 104 is formed on the entire surface of the semiconductor substrate 101 to cover the vertical transfer channels 102 and the photodiodes 103. Subsequently, the gate electrode film 105 and then the metal light-shielding film 106 made of tungsten, aluminum, silicide, salicide, or the like are formed on the gate insulating film 104.

As shown in FIG. 6B, a resist pattern 150 is formed on the metal light-shielding film 106 to have a desired pattern. Using the resist pattern, the gate electrode film 105 and the metal light-shielding film 106 are etched, to form the first and second vertical transfer electrodes 107a and 107b, each constructed of the patterned gate electrode 105 and the patterned metal light-shielding film 106, arranged alternately in the vertical direction in such a manner as to expose part of each of the photodiodes 103 while covering the vertical transfer channels 102. Although the gate electrode film 105 and the metal light-shielding film 106 are etched in a single process step using one resist pattern 150 in the illustrated example, they may be etched in separate steps. A variation to the steps shown in FIGS. 6A and 6B will be described later.

Thereafter, as shown in FIG. 6C, the transparent insulating film material 108 made of an oxide film (e.g., a silicon oxide film) or a nitride film (e.g., a silicon nitride film) is formed on the entire surface of the semiconductor substrate 101 to cover the first and second vertical transfer electrodes 107a and 107b.

As shown in FIG. 6D, the transparent insulating film material 108 is subjected to isotropic etching, to form the transparent insulating film 108 as residues of the transparent insulating film material 108 in the gaps between the first and second vertical transfer electrodes 107a and 107b. Although isotropic etching is used in the illustrated example, the transparent insulating film material 108 may be subjected to anisotropic etching, to form the transparent insulating film 108 as residues of the transparent insulating film material 108, not only in the gaps between the first and second vertical transfer electrodes 107a and 107b, but also on the sidewalls of the first and second vertical transfer electrodes 107a and 107b exposed in the openings 103R (see FIG. 1A, for example) that expose the photodiodes 103, as in the first embodiment and the second variation of the first embodiment.

Thereafter, as shown in FIG. 7A, the interlayer insulating film 109 is formed on the entire surface of the semiconductor substrate 101 to cover the first and second vertical transfer electrodes 107a and 107b and the transparent insulating film 108. Subsequently, a resist pattern 151 having a desired pattern is formed on the interlayer insulating film 109, and by etching using the resist pattern 151, contact holes 152 are formed to expose the second vertical transfer electrodes 107b. Note that although formation of the contact holes 152 is illustrated in this embodiment, this step is unnecessary in the case of manufacturing the solid-state imaging devices in the first embodiments.

As shown in FIG. 7B, after formation of a metal film on the interlayer insulating film 109 including the insides of the contact holes 152, a resist pattern 153 having a desired pattern is formed on the metal film. The metal film is then etched using the resist pattern 153, to form the metal light-shielding film 111 that is connected to the second vertical transfer electrodes 107b via the contacts 140 formed by filling the contact holes 152 with the metal film.

As shown in FIG. 7C, the interlayer insulating film 112 made of a BPSG film or the like, for example, is formed to cover the metal light-shielding film 111, and then portions of the interlayer insulating film 112 located above the photodiodes 103 are depressed by heat flow process and isotropic etching. Subsequently, the high refractive-index film 113 higher in refractive index than the interlayer insulating film 112 is formed on the interlayer insulating film 112, and then a photoresist 154 is formed on the high refractive-index film 113.

As shown in FIG. 7D, the photoresist 154 and the high refractive-index film 113 are etched back, thereby to form the inner lenses 114 constructed of the high refractive-index film 113 and the interlayer insulating film 112.

Figure 10:
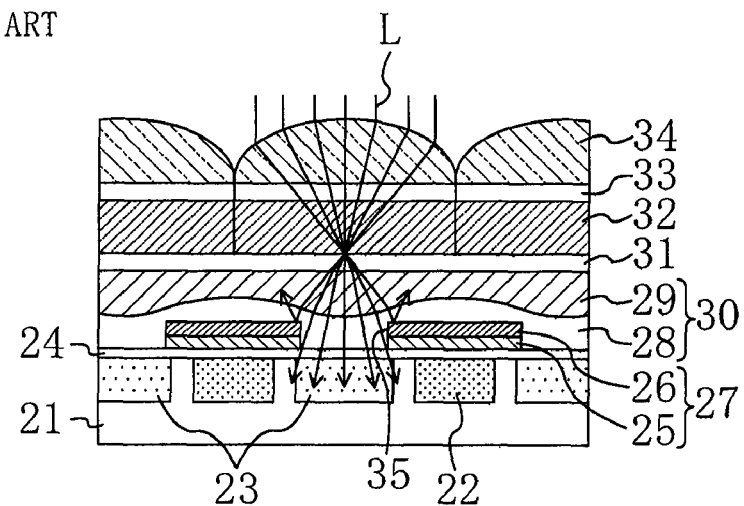
FIG. 10 is a cross-sectional view of a pixel of the conventional solid-state imaging device in the vertical direction.
Figure 11A:
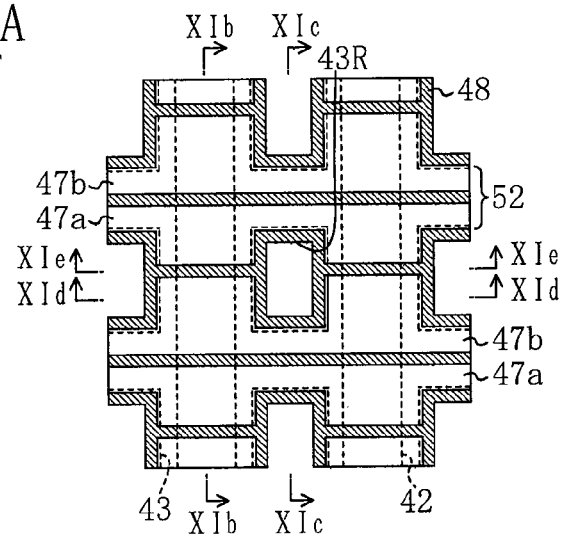
FIGS. 11A-11E are a plan view (FIG. 11A), horizontal cross-sectional views (FIGS. 11D and 11E), and vertical cross-sectional views (FIGS. 11B and 11C) showing a pixel structure of a solid-state imaging device of the first prior art example.
Figure 11B:
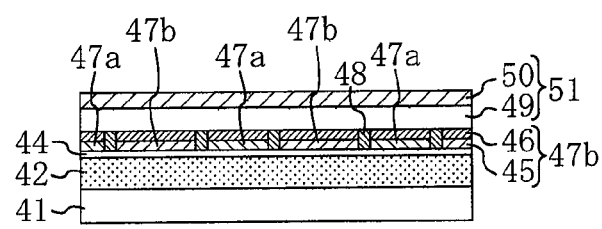
Figure 11C:
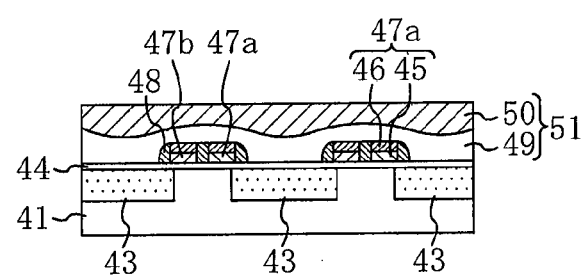
Figure 11D:
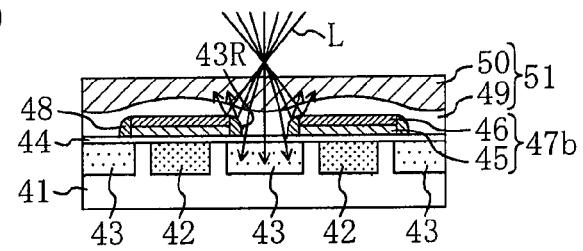
Figure 11E:
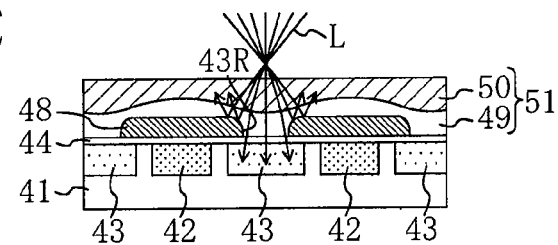
Figure 12A:
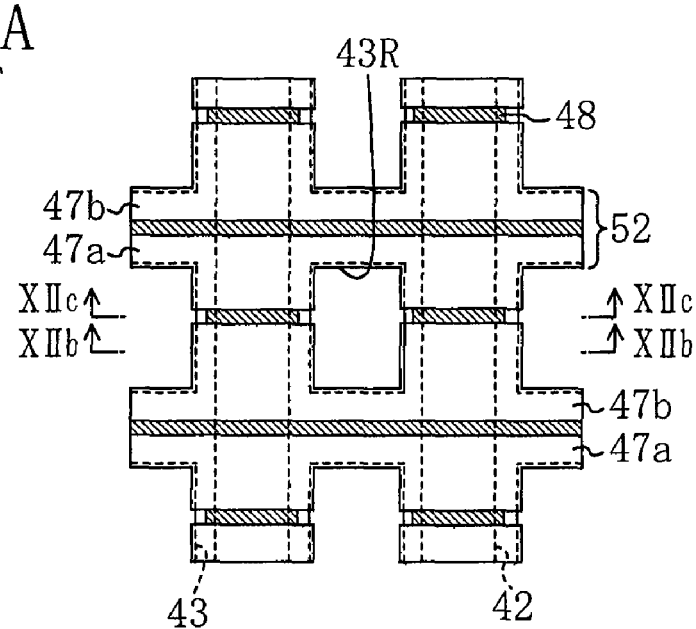
FIGS. 12A-12C are a plan view (FIG. 12A) and horizontal cross-sectional views (FIGS. 12B and 12C) showing a pixel structure of a solid-state imaging device of the second prior art example.
Figure 12B:
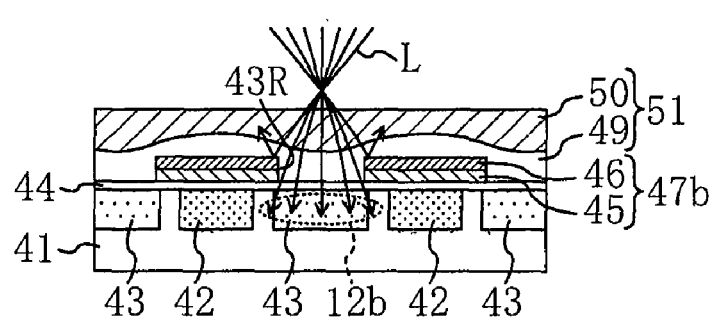
Figure 12C:
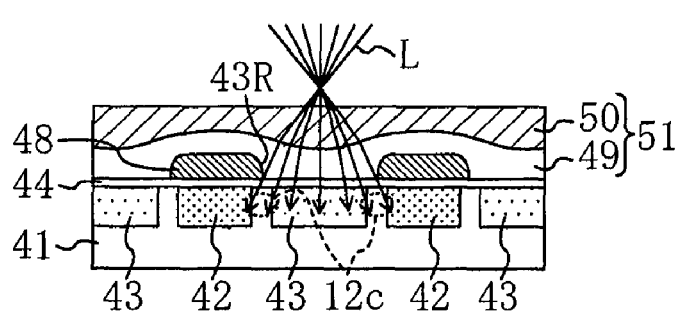

Subsequently, although not illustrated, a flattening film, color filters, another flattening film, and top lenses are formed in this order by known methods (see FIG. 10 discussed above, for example).

In the third embodiment described above, in place of the steps shown in FIGS. 6A and 6B, steps shown in FIGS. 8A-8C may be employed as follows.

Figures 8A, 8B, 8C:
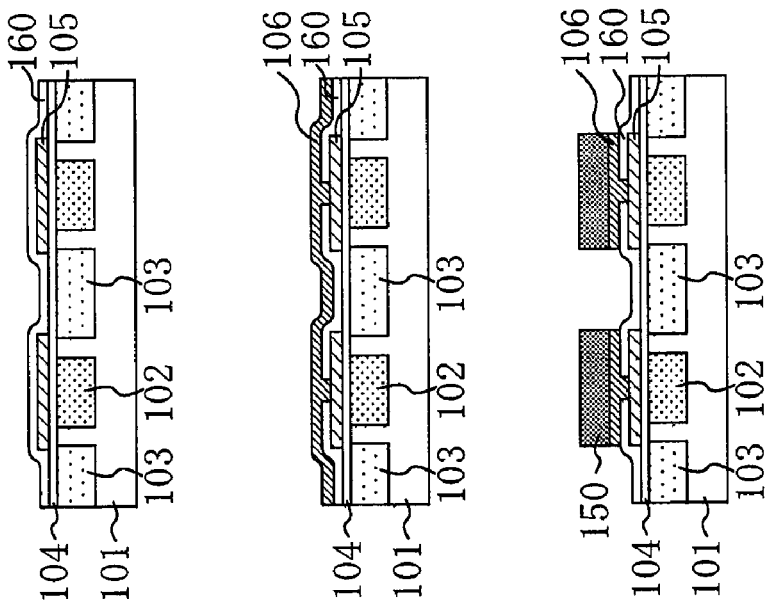
FIGS. 8A-8C are cross-sectional views showing a variation of part of the method for manufacturing a solid-state imaging device of the third embodiment of the present invention.

As shown FIG. 8A, after formation of the vertical transfer channels 102 and the photodiodes 103 in a surface portion of the semiconductor substrate 101, as in FIG. 6A, the gate insulating film 104 is formed on the entire surface of the semiconductor substrate 101. Subsequently, the gate electrode film 105 is formed on the gate insulating film 104, and then etched into a desired pattern using a resist pattern not shown. Thereafter, an insulating film 160 is formed on the entire surface of the semiconductor substrate 101 to cover the patterned gate electrodes 105.

As shown in FIG. 8B, the insulating film 160 is etched using a resist pattern not shown to form openings exposing the gate electrodes 105, and then the metal light-shielding film material 106 made of tungsten, aluminum, silicide, salicide, or the like is formed on the insulating film 160 including the openings.

As shown in FIG. 8C, the metal light-shielding film material 106 is patterned by etching using the resist pattern 150 in FIG. 6B, for example, to form the metal light-shielding film 106. The subsequent steps are the same as those in FIGS. 6C, 6D, and 7A-7D described above.

As described above, by employing the steps shown in FIGS. 8A-8C, it is possible to reduce occurrence of contamination of the semiconductor substrate with metal residues that may be produced by the etching of the gate electrode film 105 and the metal light-shielding film material 106 in the steps shown in FIGS. 6A and 6B, causing image quality deficiencies such as dark currents and pixel defects.

The present invention is useful in a solid-state imaging device, in particular, a CCD type solid-state imaging device, and a method for manufacturing the same.

What is claimed is:

1. A solid-state imaging device, comprising:
    a semiconductor substrate having, in its surface portion, a plurality of vertical transfer channel regions extending vertically and a plurality of photoelectric conversion regions arranged in a matrix with spacing from one another and lined to be adjacent to each of the plurality of vertical transfer channel regions;
    a plurality of vertical transfer electrodes, each constructed of a gate electrode and a first metal light-shielding film, formed on the semiconductor substrate via a gate insulating film so as to expose the plurality of photoelectric conversion regions and extend horizontally with spacing from one another;
    a transparent insulating film formed in gaps existing between the plurality of vertical transfer electrodes above the plurality of vertical transfer channel regions; and
    a second metal light-shielding film formed on the plurality of vertical transfer electrodes and the transparent insulating film via a first interlayer insulating film to cover at least the plurality of vertical transfer channel regions,
    wherein the plurality of vertical transfer electrodes include first vertical transfer electrodes extending horizontally passing above regions between any vertically adjacent photoelectric conversion regions and second vertical transfer electrodes also serving as read electrodes formed above regions between any horizontally adjacent photoelectric conversion regions, the first and second vertical transfer electrodes being adjacent to each other,
    the second vertical transfer electrodes are electrically connected to the second metal light-shielding film, and
    the first vertical transfer electrodes are formed under the second metal light-shielding film.

2. The solid-state imaging device of claim 1, wherein gaps between the first vertical transfer electrodes and the second vertical transfer electrodes are located on upstream and downstream sides of the regions between any horizontally adjacent photoelectric conversion regions in the vertical direction.

3. The solid-state imaging device of claim 1, wherein
    the second metal light-shielding film is vertically divided into a plurality of portions, and
    the first vertical transfer electrodes and the second vertical transfer electrodes are formed so that gaps between any adjacent portions of the second metal light-shielding film are located in the center portions of the regions between any horizontally adjacent photoelectric conversion regions.

4. The solid-state imaging device of claim 1, wherein the second vertical transfer electrodes are formed separately like islands.

5. The solid-state imaging device of claim 1, wherein the transparent insulating film is made of silicon nitride.

6. The solid-state imaging device of claim 1, further comprising:
    a second interlayer insulating film formed to cover the second metal light-shielding film and have recesses above the plurality of photoelectric conversion regions; and
    a high refractive-index film having a refractive index higher than the second interlayer insulating film, formed on the second interlayer insulating film.

7. The solid-state imaging device of claim 6, further comprising:
    color filters formed on the high refractive-index film; and
    top lenses formed on the color filters.

8. A method for manufacturing a solid-state imaging device comprising the steps of:
    (a) forming, in a surface portion of a semiconductor substrate, a plurality of vertical transfer channel regions extending vertically and a plurality of photoelectric conversion regions arranged in a matrix with spacing from one another and lined to be adjacent to each of the plurality of vertical transfer channel regions;
    (b) forming a plurality of vertical transfer electrodes, each constructed of a gate electrode and a first metal light-shielding film, on the semiconductor substrate via a gate insulating film so as to expose each of the plurality of photoelectric conversion regions and extend horizontally with spacing from one another;
    (c) forming a transparent insulating film in gaps existing between the plurality of vertical transfer electrodes above the plurality of vertical transfer channel regions; and
    (d) forming a second metal light-shielding film on the plurality of vertical transfer electrodes and the transparent insulating film via a first interlayer insulating film to cover at least the plurality of vertical transfer channel regions,
    wherein the step (c) includes a step of forming the transparent insulating film by depositing a transparent insulating film material on the entire surface of the semiconductor substrate and then subjecting the transparent insulating film material to anisotropic etching to allow the transparent insulating film material to remain in gaps existing between the plurality of vertical transfer electrodes above the plurality of vertical transfer channel regions and also remain on sidewalls of the plurality of vertical transfer electrodes exposed in the plurality of photoelectric conversion regions.

9. The method of claim 8, wherein the step (d) includes a step of further forming the second metal light-shielding film above regions between any vertically adjacent photoelectric conversion regions.

10. The method of claim 8, further comprising the steps of:
   (e) forming a second interlayer insulating film on the semiconductor substrate to cover the second metal light-shielding film and have recesses above the plurality of photoelectric conversion regions, after the step (d); and
   (f) forming a high refractive-index film having a refractive index higher than the second interlayer insulating film on the second interlayer insulating film.

11. The method of claim 10, further comprising the steps of:
   (g) forming color filters on the high refractive-index film; and
   (h) forming top lenses on the color filters.

12. A method for manufacturing a solid-state imaging device comprising the steps of:
   (a) forming, in a surface portion of a semiconductor substrate, a plurality of vertical transfer channel regions extending vertically and a plurality of photoelectric conversion regions arranged in a matrix with spacing from one another and lined to be adjacent to each of the plurality of vertical transfer channel regions;
   (b) forming a plurality of vertical transfer electrodes, each constructed of a gate electrode and a first metal light-shielding film, on the semiconductor substrate via a gate insulating film so as to expose each of the plurality of photoelectric conversion regions and extend horizontally with spacing from one another;
   (c) forming a transparent insulating film in gaps existing between the plurality of vertical transfer electrodes above the plurality of vertical transfer channel regions; and
   (d) forming a second metal light-shielding film on the plurality of vertical transfer electrodes and the transparent insulating film via a first interlayer insulating film to cover at least the plurality of vertical transfer channel regions,
   wherein the step (b) includes a step of forming the plurality of vertical transfer electrodes including first vertical transfer electrodes extending horizontally passing above regions between any vertically adjacent photoelectric conversion regions and second vertical transfer electrodes also serving as read electrodes formed above regions between any horizontally adjacent photoelectric conversion regions, the first and second vertical transfer electrodes being adjacent to each other, and
   the step (d) includes a step of forming the second metal light-shielding film to be electrically connected to the second vertical transfer electrodes via contact holes formed through the first interlayer insulating film and cover the first vertical transfer electrodes.

13. The method of claim 12, wherein the step (b) is performed so that gaps between the first vertical transfer electrodes and the second vertical transfer electrodes are located on upstream and downstream sides of the regions between any horizontally adjacent photoelectric conversion regions in the vertical direction.

14. The method of claim 13, wherein
   the step (d) includes a step of forming the second metal light-shielding film vertically divided into a plurality of portions, and
   in the step (b), the first vertical transfer electrodes and the second vertical transfer electrodes are formed so that gaps between any adjacent portions of the second metal light-shielding film are located in the center portions of the regions between any horizontally adjacent photoelectric conversion regions.

* * * * *